United States Patent
Biscarini et al.

(10) Patent No.: US 7,498,060 B2
(45) Date of Patent: Mar. 3, 2009

(54) METHOD FOR CONTROLLING AT NANOMETRIC SCALE THE GROWTH OF THIN FILMS OF CONJUGATED ORGANIC MOLECULES

(75) Inventors: Fabio Biscarini, CNR ISMN - Bologna Division, Via P. Gobetti 101, I-40129 Bologna (IT); Ricardo García García, Madrid (ES)

(73) Assignee: Fabio Biscarini (IT)

( * ) Notice: Subject to any disclaimer, the term of this patent is extended or adjusted under 35 U.S.C. 154(b) by 364 days.

(21) Appl. No.: 11/220,896

(22) Filed: Sep. 7, 2005

(65) Prior Publication Data

US 2007/0234947 A1    Oct. 11, 2007

Related U.S. Application Data

(63) Continuation of application No. PCT/ES2004/070013, filed on Mar. 8, 2004.

(30) Foreign Application Priority Data

Mar. 7, 2003    (ES)    ................. 200300565

(51) Int. Cl.
  *C23C 16/00*    (2006.01)
(52) U.S. Cl. .................. 427/255.6; 427/294; 427/96.8; 117/86; 117/39; 117/62
(58) Field of Classification Search ............ 117/86, 117/39, 62; 427/255.6, 294, 96.8
See application file for complete search history.

(56) References Cited

U.S. PATENT DOCUMENTS

| 3,663,870 | A | * | 5/1972 | Tsutsumi et al. ............ 257/411 |
| 4,674,320 | A | * | 6/1987 | Hirschfeld ................. 73/31.06 |
| 6,127,004 | A | * | 10/2000 | Hatwar et al. ............... 427/535 |
| 6,326,640 | B1 | * | 12/2001 | Shi et al. ...................... 257/40 |
| 6,887,332 | B1 | * | 5/2005 | Kagan et al. ............... 427/97.3 |
| 7,074,501 | B2 | * | 7/2006 | Czeremuszkin et al. ..... 428/690 |

(Continued)

FOREIGN PATENT DOCUMENTS

WO    WO 03/016589    *    2/2003

OTHER PUBLICATIONS

Koch, N. et al., "Optically induced electron transfer from conjugated organic molecules to charged metal clusters". Thin Solid Films, vol. 441, Issues 1-2, Sep. 22, 2003, pp. 145-149.*

(Continued)

*Primary Examiner*—Bret Chen
(74) *Attorney, Agent, or Firm*—Klauber & Jackson, LLC

(57)    ABSTRACT

The invention provides a method of controlling the spatial distribution, shape and size of films of conjugated organic molecules that can be used to grow single layers of organic molecules on silicon oxide nanostructures. The silicon oxide nanostructures are produced using an anodic oxidation process. The organisation of the molecules on the oxide nanostructures is dependent on the kinetic parameters of the latter (evaporation rate, diffusion coefficient) and on the interactions with the silicon (anodic) oxide regions. The molecules form domains which exactly reproduce the lateral size and the shape of the oxide nanostructures. The invention provides a powerful method of performing a bottom-up construction of wires, electrodes and charge transfer zones in nanoscale devices.

5 Claims, 6 Drawing Sheets

U.S. PATENT DOCUMENTS 7,098,145 B2 * 8/2006 Fukushima et al. .......... 438/758
7,166,327 B2 * 1/2007 Afzali-Ardakani et al. .. 427/301

OTHER PUBLICATIONS

Jitapa, Sumranjit. "Conjugated organic molecules as models for potential sensors". University of Masschusetts Amherst, 2007, 136 pages, AAT 3254940. Abstract Only.*

Calleja, Montserrat, et al., "Nano-oxidation of silicon surfaces by noncontact atomic-force microscopy: Size dependence on voltage and pulse duration". Appl. Phys. Lett., vol. 76, Issue 23, pp. 327-3429, Jun. 2000.*

Bouchiat, V. et al., "Resistless patterning of quantum nanostructures by local anodization with an atomic force microscope." Microelectronic Engineering 61-62 (2002) pp. 517-522.*

Ruskell, T.G. et al., "Current-dependent silicon oxide growth during scanned probe lithography." Electronic Letters, Jul. 18, 1996, vol. 32 No. 15 pp. 1411-1412.*

Garcia, Ricardo, "Bridging Nano and Macro Worlds with Water Meniscii: Attomol Chemistry and Nanofabrication by Local Oxidation Nanolithography." LITHO 2004, Jun. 12-16, 2004, Agelonde-France. no page numbers.*

* cited by examiner

METHOD FOR CONTROLLING AT NANOMETRIC SCALE THE GROWTH OF THIN FILMS OF CONJUGATED ORGANIC MOLECULES

CROSS-REFERENCE TO RELATED APPLICATIONS

The present application is a Continuation of co-pending PCT Application No. PCT/ES2004/070013, filed Mar. 8, 2004, which in turn, claims priority from Spanish Application Serial No. P200300565, filed Mar. 7, 2003. Applicants claim the benefits of 35 U.S.C. § 120 as to the PCT application and priority under 35 U.S.C. § 119 as to said Spanish application, and the entire disclosures of both applications are incorporated herein by reference in their entireties.

FIELD OF THE INVENTION

Nanoscale manufacturing processes for polymer structures and thin films of organic molecules.

BACKGROUND OF THE INVENTION

Conjugated materials constitute a family of organic materials formed from coordinated compounds, polymers, copolymers and polymer mixtures which are characterised by the existence of functional groups with electron orbitals delocalised on different carbon atoms or other atoms, fundamentally nitrogen, oxygen or sulphur. These materials display optical and electronic properties similar to those observed in silicon or III-V semiconductors and are generically referred to as organic semiconductors. The spatial distribution of the charge density of the pi orbitals is highly anisotropic and as a consequence their optical and electronic properties depend on the orientation and on the molecular groupings.

Plastic electronics is a new sustainable type technology based on the use of thin films of conjugated compounds whose thicknesses vary between 1 and 100 nm. The products of plastic electronics are complementary to those of microelectronics since they are concentrated in low cost applications and they can take recycling or their waste has a very low environmental impact. As examples, mention can be made of the manufacture of labels, cards and intelligent clothing or electronic Identity cards. Conjugated compounds are easy to process and compatible with microelectronic processes. Nevertheless, it is crucial to control the molecular orientation, the order and the anisotropy of the molecular domains in order to obtain efficient devices.

The improvement in the electronic properties of a device formed from electronic molecules requires an understanding and control of the interactions between the organic molecules and the biological material. This is a complex problem since in an integrated circuit type device there coexist regions of differing properties, both chemical and electrical or topographical. All this means that the molecules undergo different interactions. This heterogeneity has an influence on the nucleation and growth processes, which in the end will determine the structure and morphology of the film. A self-organised growth would be very desirable since it would permit the active elements to be connected to the electrodes which would lead to a growth in the integration of the devices. All this makes it necessary to develop new procedures for promoting the spontaneous organisation of organic molecules.

Cited below are some patents and applications for obtaining nanostructures of organic materials.

1. Kano et al., Alps Electric Co. Ltd. (JP) Appl. No. 170715 Oct. 13, 1998;
2. Cox et al., Borealis Technical Limited (London UK), Appl. No. 045299 Mar. 20, 1998;
3. Biebuyck and Michel, International Business Machine Corporation (Armonk N.Y.), Appl. No. 690956 Aug. 1, 1996;
4. Calveley (Private Bag, MBE N180 Auckland, NZ) Appl. No. 474420, Dec. 29, 1999;
5. Chou S. and Zhuang L. (Princeton University NJ), Appl. No. WO 00/21689, April, 2000.
6. M. Murgia, P. Mei, F. Biscarini, C. Taliani (CNR-ISM Bologna, Italy) Italian Appl. No. MI 2000 A002075 Oct. 8 2001, extension PCT/EP02/11218 on October 7.
7. Katz H. E. (Agere Systems Guardian Corp. Orlando, Fla.), U.S. Pat. No. 6,403,397, Jun. 11, 2002.
8. Bulovic V. and Forrest S. R. (The Trustees of Princeton University, Princeton N.J.) U.S. Pat. No. 6,458,426, Oct. 1, 2002.
9. Cavallini M. and Biscarini F. (CNR-ISMN Sez. Bologna, Italy) Italian Appl. MI2002A001961, Sep. 16, 2002.

A sign of the impact of nanotechnology on the economic growth of developed economies can be seen from the level of government investment in Europe, USA and Japan. For example, in the sixth framework programme of the EU, nanotechnology is a priority area with financing of more than 1300 M.

SUMMARY OF THE INVENTION

The invention consists of a process which permits the growth of organic molecules in defined regions of a silicon substrate. The said regions are defined by means of the anodic oxidation of a selective region of the sample. The anodic oxidation process produces a silicon oxide with numerous defects which modifies both the topography and the chemical composition. The oxidation is used to create structures extending from a few nanometres up to tens of microns. The shape and periodicity of the nanostructures is variable. Matrices of points, lines, matrices of parallel lines, tracks and circles have been manufactured.

The molecules preferentially nucleate on the oxide nanostructures, which originates a monolayer of molecules that reproduce the shape and size of the silicon oxide nanostructure. The validity of the proposed method is demonstrated with molecules of •-sexithionyl (T6) deposited by sublimation in an ultra high vacuum chamber. Due to the kinetics of the growth and the preferential, though non-specific, interactions of the molecules with the silicon oxide regions, structures of organic molecules are formed which reproduce the shape and size of the nanostructures (see FIG. 1 and FIGS. 3 and 4). The tracks or strips of organic molecules have a length of several microns and their width varies between 100 and 600 nm. From the height of the molecules, it is deduced that they are orientated with their longitudinal axis perpendicular to the substrate.

The same material grown on an unmodified silicon substrate does not give rise to the formation of ordered structures. The molecules are grouped forming islands of irregular shape and distribution and with diameters of several microns.

The proposed method could be used for manufacturing wires and conduction channels in integrated circuits made of a plastic material with pattern densities of between three and ten times greater than those obtained with ultraviolet optical lithography.

The silicon oxide regions were obtained by means of anodic oxidation, for which purpose an atomic-force microscope (AFM) was used. The method is known as local oxidation nanolithography. A detailed description of it can be found in references 1-4. Nevertheless, the process is completely general and valid for any production method of anodic silicon oxides.

With the proposed method, an integrated circuit could be manufactured with active elements formed by organic molecules and with a pattern density of between three and ten times greater than those obtained with ultraviolet optical lithography.

The silicon oxide regions were obtained by means of anodic oxidation, for which purpose an atomic-force microscope (AFM) was used. The method is known as local oxidation nanolithography. A detailed description of it can be found in references 1-4. Nevertheless, the process is completely general and independent of the technique employed for producing anodic oxides.

The arrangement used for carrying out anodic oxidation is shown in diagrammatic form in FIG. 2. The head of an atomic-force microscope is introduced into a chamber permitting control of the relative humidity. The relative humidity is kept at between 30-50%. The oxidations are carried out with silicon microlevers (n+) characterised by force constants of between 30-40 N/m and resonance frequencies between 300-400 kHz. The semiconductor samples were of Si(100) type p and with resistivities of 14·cm.

The local oxidation process in the mode of atomic-force microscope non-contact requires several stages. First, the tip-microlever system oscillates at a distance of about 5 nm from the sample surface. The surface of the sample has previously been coated with a few monolayers of water. After that, a voltage is applied between the tip and sample. If the applied voltage exceeds a certain threshold value, a neck of water of formed between the two surfaces. Another voltage pulse is then introduced in order to initiate the oxidation. Once the above process has been completed, the microscope returns to the visualisation mode, which permits images of the modified zones to be taken. In certain situations, those which have been used in these experiments, the same voltage pulse can be used to form the neck and grow the oxide.

The electron current measured during the oxidation process is very close to that expected for anodic oxidation processes if it is calculated starting from the volume of oxide generated and it is assumed that the reaction is described by $$Si+2h^++2(OH^-)=>SiO_2+H_2 \qquad (1)$$

The above reaction implies the decomposition of water molecules according to $$2H_2O=>2H^++2(OH^-) \qquad (2)$$

while the oxidation that takes place in the anode (here the sample) is described as $$Si+2h++2(OH^-)=>Si(OH)_2=>SiO_2+2H++2e- \qquad (3)$$

Furthermore, the process involves the generation at the cathode according to $$2H++2e-=>H2 \qquad (4)$$

Nevertheless, the proximity existing between the tip and the sample and the application of voltage pulses in the range 10-20 V originates high electric fields (E~1-3 V/nm). Those fields modify the chemical equilibrium established by the above equations and favour the distribution of defects in the oxide. As a consequence, a high concentration of positively charged defects $H_3O+$——$O$——$Si$ are generated in the proximity of the Si/SiOx interface.

In order to demonstrate the advantages of the proposed method for controlling and directing the growth of molecular films at the nanoscale, a series of parallel tracks have been manufactured of length 6·m, width 360-550 nm and height 3 nm (FIG. 4). The height of the patterns almost coincides with the Van der Waals length of T6 (2.7 nm). Each track is composed of eight lines and each line is a sequence of oxide points. The separation between oxide points (~10 nm) is less than their diameter (~20-40 nm) as a consequence, the points overlap and a continuous line is formed. The oxide points have been obtained by means of the application of a voltage peak of 20 V during 10 ms.

Once the sample with the oxide patterns had been manufactured, it was transferred to the ultra high vacuum chamber in order to proceed with deposition of the molecules. During the deposition, the results obtained by Biscarini et al. were applied, which demonstrate a layer to layer growth in a band of deposition temperatures (50-150° C.) and small thicknesses (1-10 microns) [6-9]. In these experiments, rated thicknesses of 1.5 nm were deposited while the sample was kept at a temperature of 150° C.

FIGS. 5(*a*) and (*b*) show the results obtained. We wish to emphasise three results. First, away from the modified zones the molecules display morphologies characterised by islands having a fractal appearance and characteristic dimensions of 1·m. Second, within the modified zone the molecules preferentially grow along the oxide tracks. The coating of the molecules is greater on the tracks than on the unmodified zones between them. Third, the continuity of the film depends on the lateral spacing of the oxide lines forming the tracks. Those tracks whose lines are more separated show more fractures in the organic film. In the first track from the left (FIG. 5), the lines forming the track overlap giving rise to a uniform and continuous film. In some zones of the film the molecules also display a lateral growth with dendritic shapes. This growth indicates that there exists an excess of molecules since not all of them can be accommodated on the oxide track.

Moreover, when the lateral separation of the lines is increased, the continuity of the film is broken. The above images permit the inference that the growth of a continuous film in an arbitrary manner is a competition between the diffusion coefficient of the molecules on the unmodified substrate, the density of the molecules and the preferential growth observed on the oxide lines. The preferential growth along the oxide lines increases when the number of oxidations effected in order to form the line is increased. Here, the density of defects is controlled by reducing the lateral separation of the individual lines.

FIG. 6 shows tracks or strips of organic molecules grown by means of the proposed method. The pattern that is manufactured has the shape of an orthodox cross with tracks that cut each other perpendicularly (FIG. 6*a*). The difference between the density and uniformity of the domains of molecules on the oxide nanostructures and on the unmodified substrate does not cease to cause surprise.

To summarise, the present development demonstrates that control of the kinetic parameters during growth and the existence of preferential interactions of organic molecules with the silicon oxide structures make it possible to carry out the nanoscale manufacture of structures formed by conjugated molecules.

REFERENCES

Figure 1:
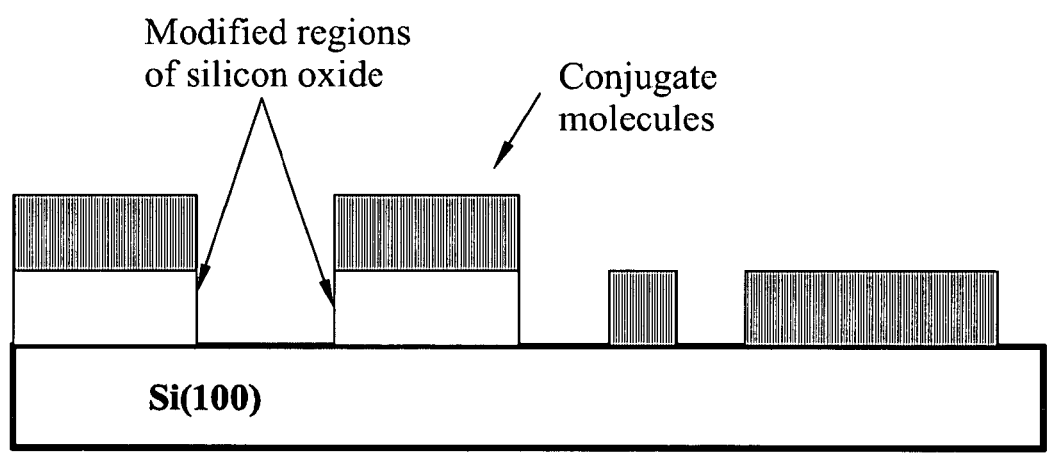
FIG. 1. Diagram of the result of the invention. The organic molecules spontaneously grow on the manufactured zones of silicon oxide. The size and shape of the molecular film is controlled by the nanostructure of the oxide. Outside the modified regions the molecules adopt irregular shapes and sizes.
Figure 2:
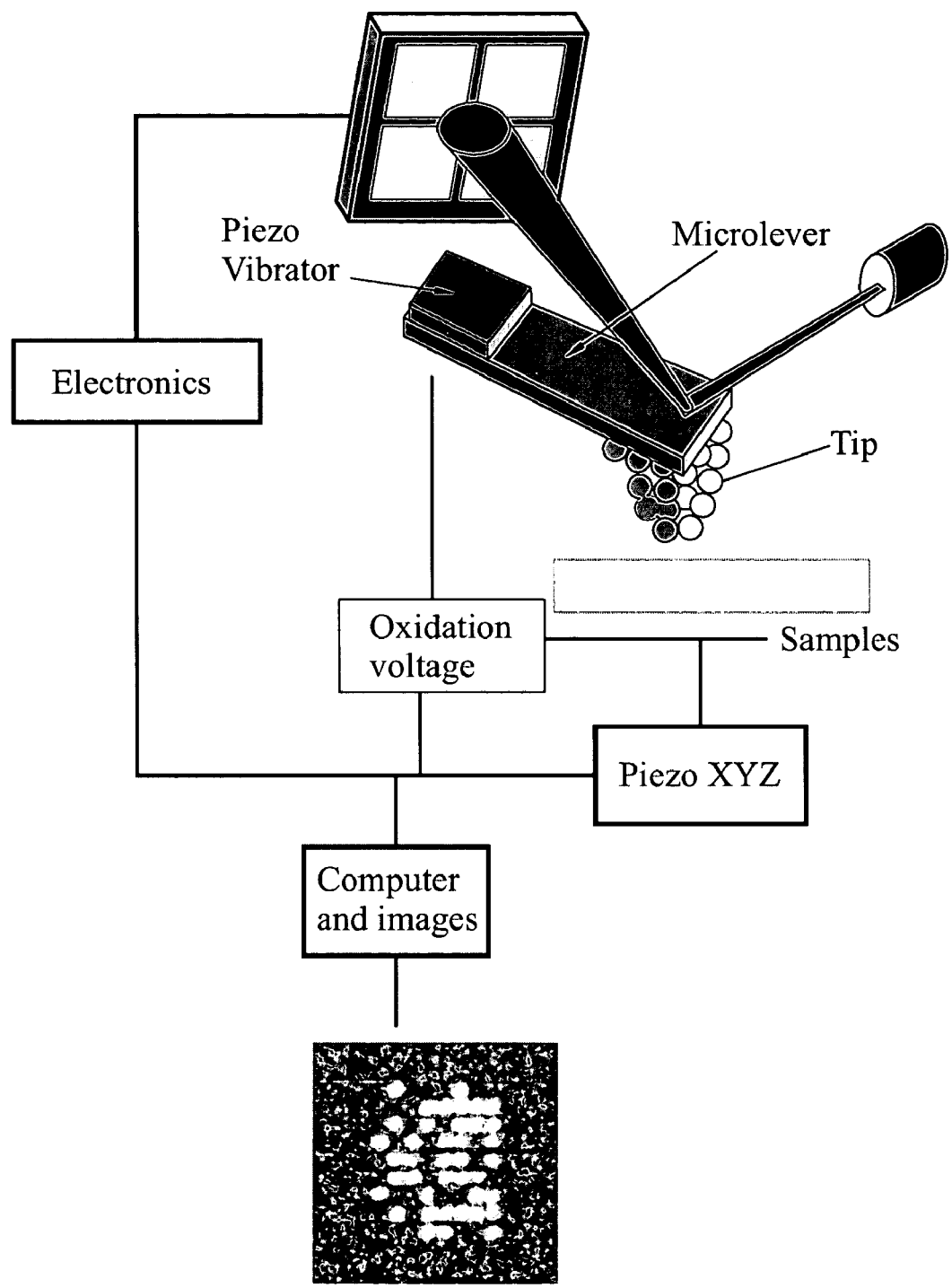
FIG. 2. Diagram of the arrangement used for carrying out the anodic oxidation.
Figure 3:
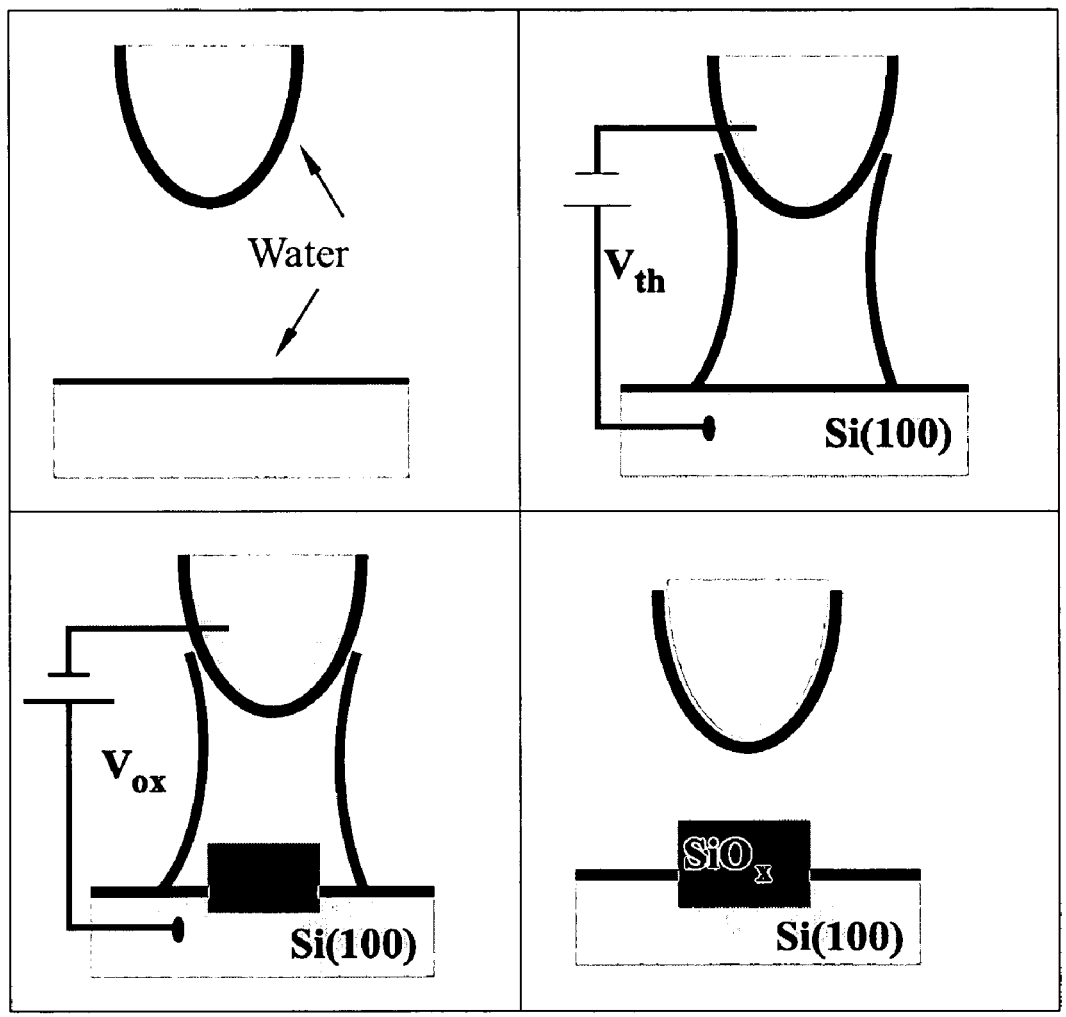
FIG. 3. Diagram of the local oxidation process used in this patent.
Figure 4:
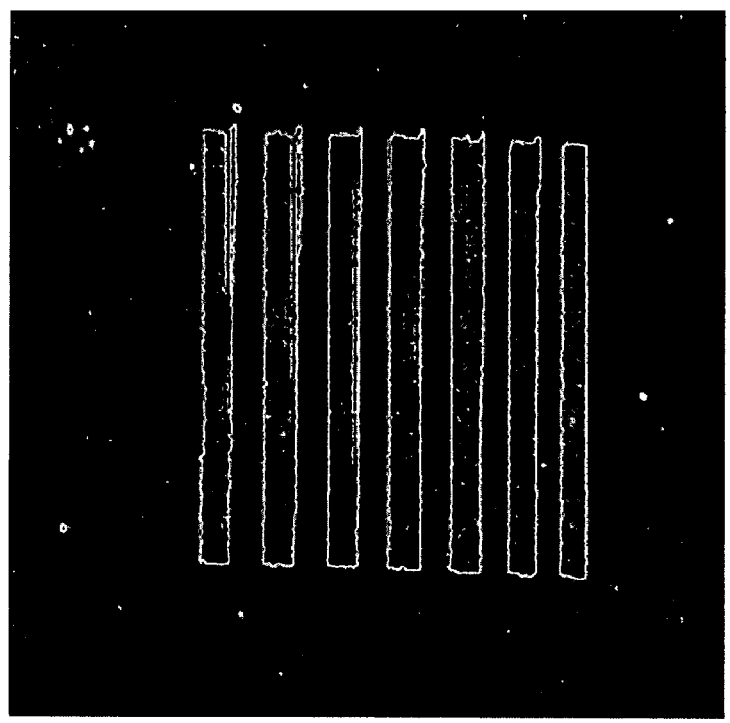
FIG. 4. AFM image of a series of parallel tracks manufactured by the method of anodic oxidation of silicon.
Figure 5A:
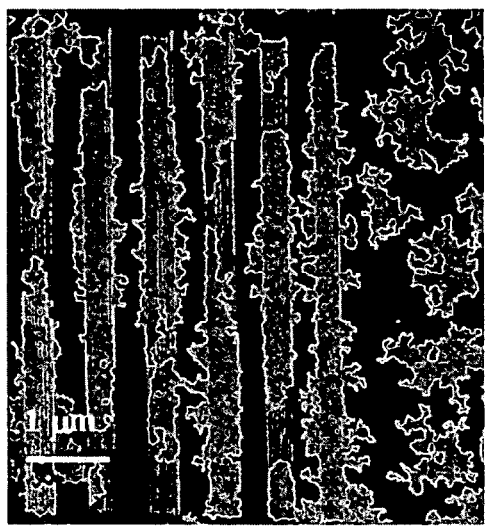
FIG. 5. (a) AFM image of silicon oxide nanostructures after the deposition of 1.5 nm of T6 molecules. (b) Section of the previous image. The continuity of the organic film is obtained by increasing the density of anodic oxide patterns.
Figure 5B:
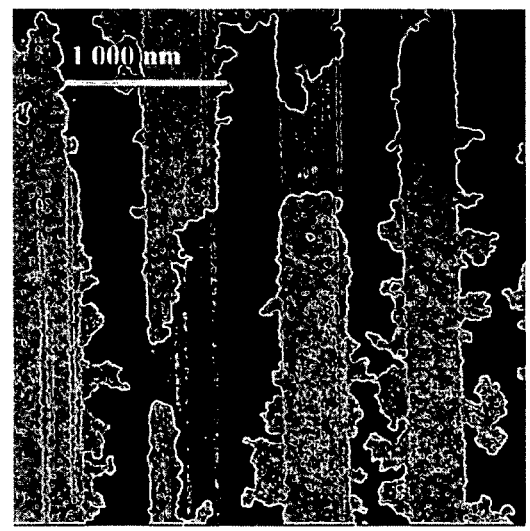
Figure 6A:
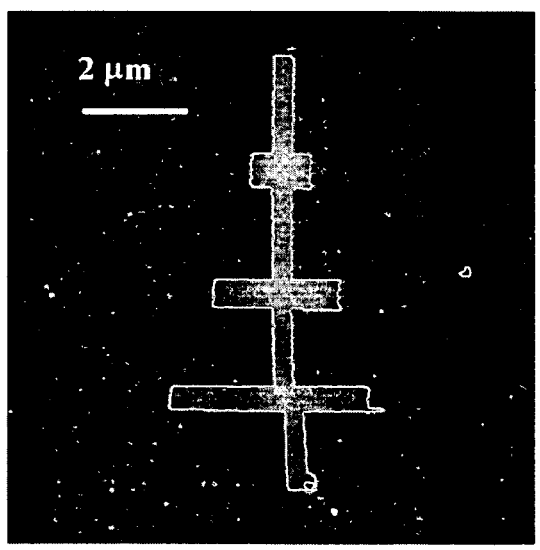
FIG. 6. (a) AFM image of orthogonal tracks of silicon oxide. (b) AFM image after deposition of molecules on the structure shown in (a).
Figure 6B:
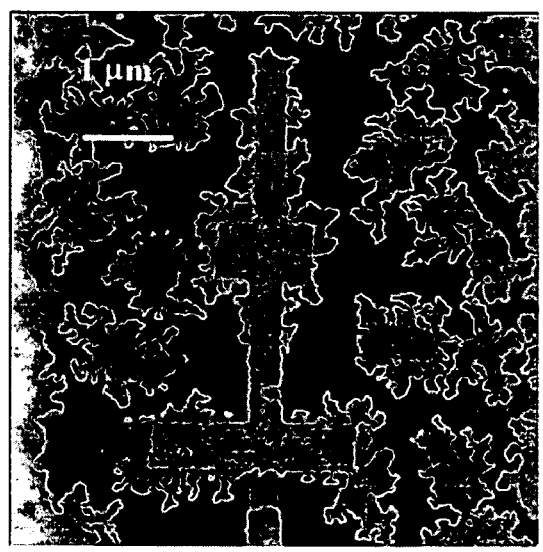

1. R. García, M. Calleja, F. Pérez-Murano, Appl. Phys. Lett. 72, 2295 (1998).
2. R. García, M. Calleja and H. Rohrer, J. Appl. Phys. 86, 1898 (1999).
3. M. Calleja and R. García, Appl. Phys. Lett. 76, 3427 (2000).
4. M. Tello and R. García, Appl. Phys. Lett. 79, 424 (2001).
5. J. A. Dagata, T. Inoue, J. Itoh, K. Matsumoto, H. Yokoyama, J. Appl. Phys., 84, 6891 (1998).
6. F. Biscarini, R. Zamboni, P. Samorí, P. Ostoja and C. Taliani, "Growth of Conjugated Oligomer Thin Films Studied by Atomic-Force Microscopy", Phys. Rev. B 52, 14868 (1995).
7. S. Prato, L. Floreano, D. Cvetko, V. DeRenzi, A, Morgante, S. Modesti, F. Biscarini, C. Taliani, R. Zamboni, "Anisotropic Ordered Planar Growth of a-sexithienyl Thin Films", J. Phys. Chem. B 37, 7788 (1999).
8. M. Brinkmann, F. Biscarini, C. Taliani, I. Aiello and M. Ghedini, "Growth of Mesoscopic Correlated Droplet Patterns by High-Vacuum Sublimation", Phys. Rev. B Rapid Comm. 61, R16339 (2000).

The invention claimed is:

1. A method for making a film of conjugated organic molecules wherein the method takes place on selected regions or nanostructures of a substrate of silicon comprising the following steps:
    a) generating a region or nanostructure of anodic silicon oxide by means of local oxidation nanolithography with AFM tips or ultraviolet optical lithography, and
    b) growing organic molecules on the selected regions or nanostructures produced by means of local oxidation nanolithography with AFM tips or ultraviolet optical lithography.

2. A method according to claim 1 wherein the growing growing organic molecules on the selected regions or nanostructures produced by means of local oxidation nanolithography or ultraviolet optical lithography is performed by means of a sublimation process in a vacuum chamber.

3. A method according to any one of claims 1 to 2 wherein the organic molecule is α-sexithionyl.

4. A method according to claim 1 wherein the film is used in the manufacture of a microelectronic or optoelectronic device.

5. A method according to claim 4 wherein the microelectronic device consists of an integrated circuit.

* * * * *

UNITED STATES PATENT AND TRADEMARK OFFICE
CERTIFICATE OF CORRECTION

PATENT NO. : 7,498,060 B2  
APPLICATION NO. : 11/220896  
DATED : March 3, 2009  
INVENTOR(S) : Fabio Biscarini and Ricardo Garcia Garcia Page 1 of 1

It is certified that error appears in the above-identified patent and that said Letters Patent is hereby corrected as shown below:

Title page, Item [73] should read  
Assignees: Consejo Superior De Investigaciones Cientificas Signed and Sealed this  
Twenty-sixth Day of April, 2011

David J. Kappos  
*Director of the United States Patent and Trademark Office*